United States Patent [19]
Arnett et al.

[11] Patent Number: 6,165,018
[45] Date of Patent: Dec. 26, 2000

[54] CONNECTOR HAVING INTERNAL CROSSTALK COMPENSATION

[75] Inventors: Jaime Ray Arnett, Fishers, Ind.; Jerry L. Glenn, Omaha, Nebr.; Julian Robert Pharney, Indianapolis, Ind.; George Willis Reichard, Carmel, Ind.; William Tracy Spitz, Indianapolis, Ind.; Paul John Straub, Mooresville, Ind.; Dennis Lamar Troutman, Fishers, Ind.; Cherie L. Wolfe, Greenwood, Ind.

[73] Assignee: Lucent Technologies Inc., Murray Hill, N.J.

[21] Appl. No.: 09/300,543

[22] Filed: Apr. 27, 1999

[51] Int. Cl.[7] .......................... H01R 13/66; H01R 33/945
[52] U.S. Cl. ........................... 439/620; 439/941; 439/660
[58] Field of Search ................................... 439/941, 660, 439/620

[56] References Cited

U.S. PATENT DOCUMENTS

| | | |
|---|---|---|
| 4,405,187 | 9/1983 | Miller et al. . |
| 4,761,145 | 8/1988 | Goto et al. .............................. 439/469 |
| 4,997,376 | 3/1991 | Buck et al. .............................. 439/660 |
| 5,224,867 | 7/1993 | Ohtsuki et al. ......................... 439/108 |
| 5,299,956 | 4/1994 | Brownell et al. ....................... 439/638 |
| 5,431,584 | 7/1995 | Ferry ....................................... 439/620 |
| 5,562,479 | 10/1996 | Pallas et al. ............................ 439/404 |
| 5,697,816 | 12/1997 | Wu .......................................... 439/660 |
| 5,716,237 | 2/1998 | Conorich et al. ....................... 439/660 |
| 5,906,518 | 5/1999 | Sun ......................................... 439/660 |
| 5,911,602 | 6/1999 | Vaden ..................................... 439/941 |
| 5,947,772 | 9/1999 | Arnett et al. ............................ 439/941 |
| 5,971,809 | 10/1999 | Ho .......................................... 439/660 |
| 5,980,325 | 11/1999 | Horchler ................................. 439/660 |
| 5,989,069 | 11/1999 | Tan ......................................... 439/620 |

*Primary Examiner*—Neil Abrams
*Assistant Examiner*—Hae Moon Hyeon

[57] ABSTRACT

An electrical connector, comprising an insulating housing, a plurality of conductors mounted within the insulating housing in at least two rows of aligned pairs, a first compensation section which provides a first crosstalk compensation, and a second compensation section which provides a second crosstalk compensation. A first end portion of each conductor is adapted to electrically connect with contacts of another connector while a second end portion of each conductor is adapted to electrically connect with an electrical device such as a printed circuit board. The first compensation section is located within the insulating housing with the conductors being arranged therein in an orientation to provide the first crosstalk compensation. The second compensation section further is located within the connector and typically comprises a multi-layered circuit board.

11 Claims, 7 Drawing Sheets

CONNECTOR HAVING INTERNAL CROSSTALK COMPENSATION

FIELD OF THE INVENTION

The present invention relates generally to reducing electrical signal interference which arises due to parallel contacts in electrical connectors. More particularly, it relates to providing compensation for crosstalk created by such contacts in circuit board mount jacks.

BACKGROUND OF THE INVENTION

Connectors of the type known as circuit board mount jacks typically are used to provide electrical connection between multi-conductor cables and printed circuit boards. One popular type of cables, known as untwisted shielded pair ("UTP") cables, typically includes a plurality of unshielded twisted wire pairs. Common mount jacks for such cables usually comprise an insulative housing which includes two rows of electrical conductors. One end of the conductors provides a female mating section for electrical connection with a plug of the cable, while the other end comprises a plurality of solder pins that are adapted to be soldered to a printed circuit board.

As known in the art, undesired portions of desired signal power can be coupled to the individual conductors of adjacent conductor pairs in mount jacks when an electrical signal of a given frequency is transmitted therethrough. This coupling is due to the mutual capacitance and mutual inductance between adjacent pairs of conductors that are not in balance, thus yielding a residual coupling termination. This property results in crosstalk. The extent of the crosstalk is governed primarily by geometrical orientation and in particular by the spacing and angular orientation of the offended line pair. Crosstalk also will depend upon the constituent parameters of the intervening volume, such as dielectric constant and magnetic permeability. Furthermore, the extent of the crosstalk is a function of the frequency of the offending signal. Crosstalk usually increases logarithmically as the frequency of the signal increases and commonly is expressed as 10× log of the ratio of the offended pair crosstalk power divided by the offending pair signal power (decibels or dB).

As electrical connectors such as circuit board mount jacks are utilized more frequently in high frequency data and communication applications, the crosstalk that arises in the adjacent and parallel contacts of the jack has become a problem in the industry. This problem is exacerbated due to the trend toward miniaturization as well as due to FCC rules which require less than optimal orientation of the contacts within the jacks. In an effort to minimize the effects of such crosstalk, standards have been developed in the industry for controlling crosstalk. For example, in category 5 of ANSI/TIA/EIA, it is required that a connector exhibit a pair to pair nearend crosstalk ("NEXT") loss which does not exceed 40 dB at 100 MHz. Since 25 pair miniature connectors are designed to carry six times the signals of ordinary four pair cable, this requirement should be met on a more stringent power sum basis (i.e., category 5E) since, for each pair, crosstalk couplings from all the other pairs must be considered.

Previous solutions to the crosstalk problem have provided mixed results. In one such solution, a crosstalk compensation circuit is positioned on the printed circuit board external to the circuit board mount jack. However, such an arrangement creates certain problems: (a) the compensation circuit occupies valuable real estate on the printed circuit board; (b) openness of the compensation susceptibility to other induced field interference (e.g., EMI); and (c) adequate compensation is made incrementally more difficult by the distance from which the compensation circuit is spaced from the source of the crosstalk. In another solution disclosed in U.S. Pat. No. 5,562,479, issued to Passas and Winings, crosstalk compensation is provided within a 25 pair connector. In particular, the connector comprises a mandrel portion in which the individual conductors of the connector are arranged in an orientation to compensate contact area crosstalk. Although the mandrel provides for substantial crosstalk compensation, the amount of compensation can be inadequate because the connector lead frame itself behaves as a source of crosstalk. As for other techniques conventionally used to limit the effects of crosstalk, these techniques often suffer from a deterioration of crosstalk compensation.

From the above, it can be appreciated that it would be advantageous to have an electrical connector, such as a circuit board mount jack, that includes internal crosstalk compensation and that satisfies category 5E of ANSI/EIA/TIA.

SUMMARY OF THE INVENTION

The present invention is an electrical connector, comprising an insulating housing, a plurality of conductors mounted within the insulating housing in at least two rows of aligned pairs, a first compensation section which provides a first crosstalk compensation, and a second compensation section which provides a second crosstalk compensation. A first end portion of each conductor is adapted to electrically connect with contacts of another connector while a second end portion of each conductor is adapted to electrically connect with an electrical device such as a printed circuit board. The first compensation section is located within the insulating housing with the conductors being arranged therein in an orientation to provide the first crosstalk compensation. The second compensation section further is located within the connector and typically comprises a multi-layered circuit board.

The objects, features, and advantages of this invention will become apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
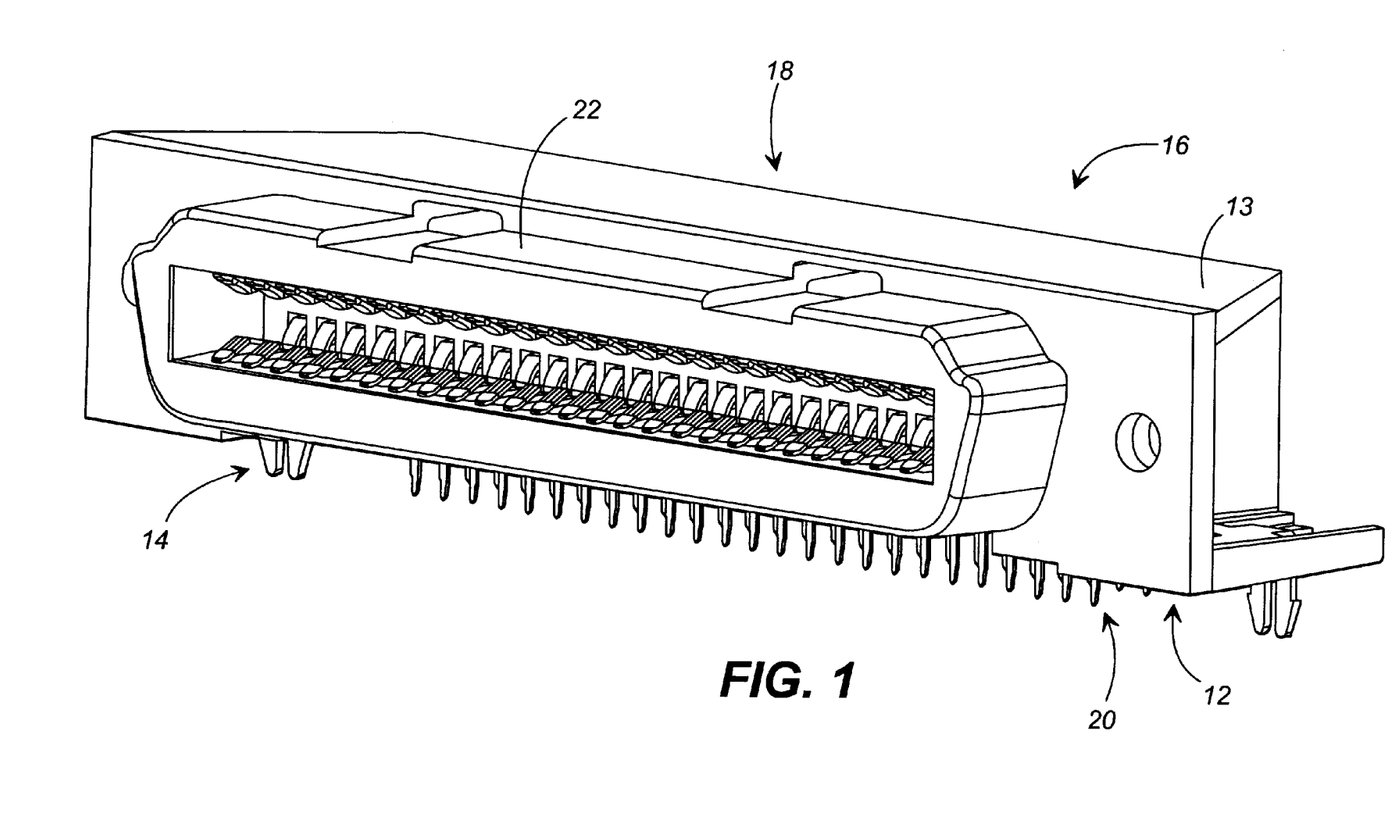
FIG. 1 is a perspective view of a connector constructed in accordance with the principles of the present invention.
Figure 2:
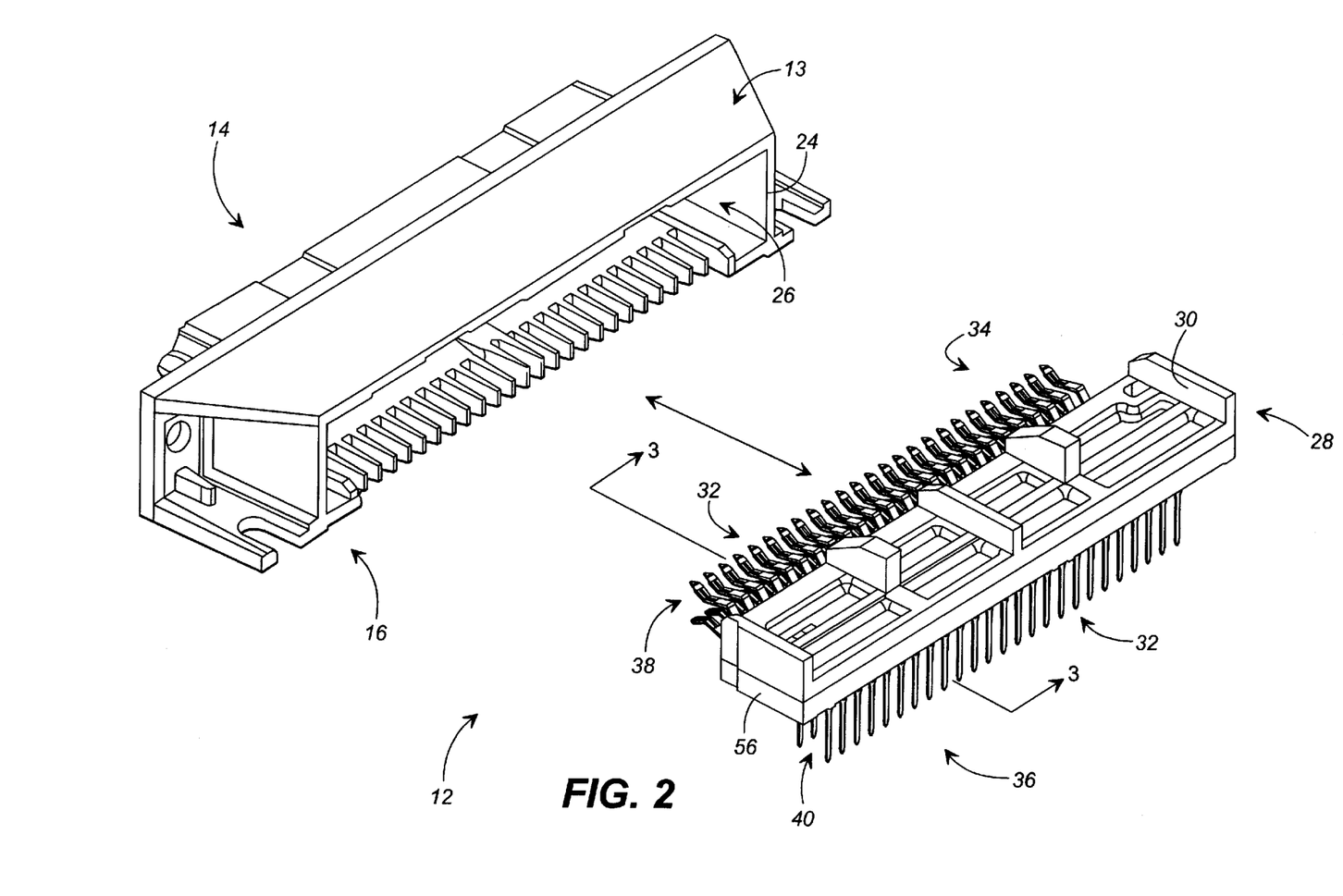
FIG. 2 is an exploded perspective view of the connector shown in FIG. 1.

Referring now in more detail to the drawings, in which like numerals indicate corresponding parts throughout the several views, FIGS. 1 and 2 illustrate an electrical connector 10 constructed in accordance with the present invention. These figures depict a circuit board mount jack suitable for connecting a 25 pair UTP cable (not shown) to a printed circuit board (not shown). Although the specific embodiments described in the present disclosure specifically pertain to a circuit board mount jack, it will be understood that the principles described herein are equally applicable to electrical connectors in general.

With reference to FIGS. 1 and 2, the connector 10 comprises an insulating housing 13 including an exterior insulating housing 12, typically constructed of a polymeric material. As indicated in these figures, the insulating housing 13 includes a front side 14, a rear side 16, a top side 18, and a bottom side 20. The front side 14 includes a plug receptacle 22 that is adapted to receive a male plug of the UTP cable (FIG. 1). As indicated in the exploded view of FIG. 2, the rear side 16 of the exterior insulating housing 12 includes an opening 24 which provides access to an interior space 26 of the housing. This interior space 26 is sized and configured to receive a contact assembly 28. The contact assembly 28 generally comprises a contact assembly housing 30 and a plurality of conductors 32 that extend therethrough. Like the exterior insulating housing 12, the contact assembly housing 30 normally is constructed of a polymeric material and therefore normally comprises an insert-molded piece of material. The assembly housing includes at least a front side 34 and a bottom side 36.

Figure 3:
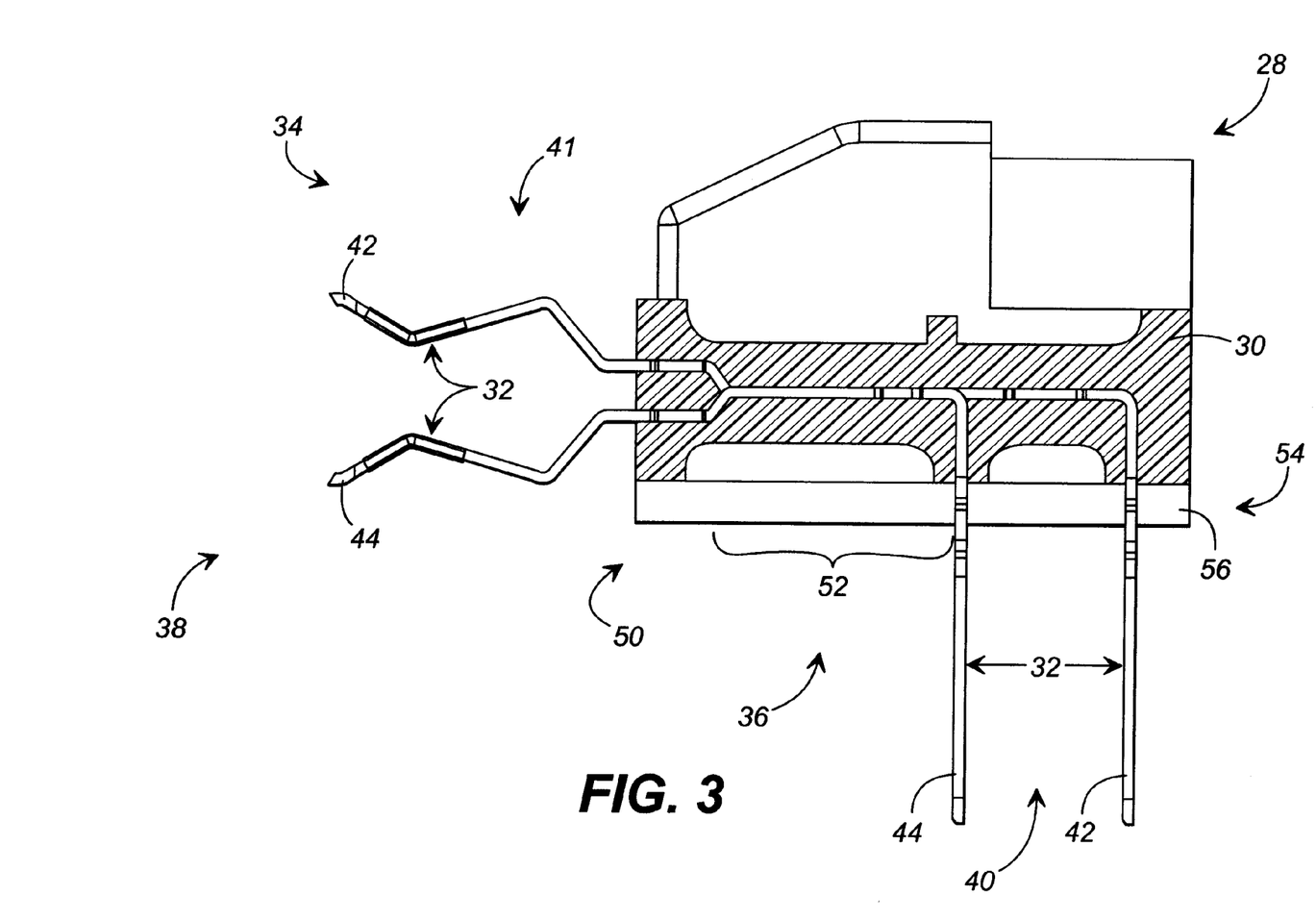
FIG. 3 is a cross-sectional side view of an assembly housing shown in FIGS. 1 and 2.

As is illustrated most clearly in FIGS. 2 and 3, the conductors 32 typically are mounted within the contact assembly housing 30 in two aligned rows that extend both outwardly from the front side 34 of the assembly housing 30, and downwardly from the bottom side 36 of the housing. The number of conductors 32 in each row is the same, for example 25, such that the conductors further are arranged as a plurality of conductor pairs, with each pair comprising a conductor from each row. Like each row, each conductor 32 extends from the front side 34 to the bottom side 36 of the assembly housing 30 as depicted in FIG. 3. In particular, each conductor 32 includes a first end portion 38 that extends from the front side 34 of the assembly housing 30 and a second end portion 40 that extends from the bottom side 36 of the housing. The first end portions 38 are configured in their respective rows so as to form a contact mating section 41 which is adapted to receive a correspondingly configured set of contacts of the cable plug. The second end portions 40 of the conductors 32 are configured as soldering pins which are adapted to be connected to a printed circuit board as by soldering.

With particular reference to FIG. 3, each conductor pair includes a first conductor 42 and a second conductor 44 which, by way of convention, comprise a tip (T) conductor and a ring (R) conductor such that the conductors are arranged as a row of tip conductors and a row of ring conductors at both the front and bottom sides 34 and 36 of the assembly housing 30. As explained above, crosstalk in connectors such as that described herein normally is created by the conductors 32 at the contact mating section 41, in the present case between the first end portions 38 of the conductors. To compensate for this crosstalk, the connector 10 of the present disclosure includes internal compensation such that compensation external to the connector is unnecessary. In a preferred arrangement, the connector 10 includes a two-stage compensation system 50. The first stage of compensation occurs within the contact assembly housing 30 between the first and second end portions 38 and 40 of the housing at a first compensation portion 52. Within this first compensation portion 52, the relative orientation of the conductors 32 is modified such that both a capacitive and inductive compensation crosstalk is created.

Figure 4:
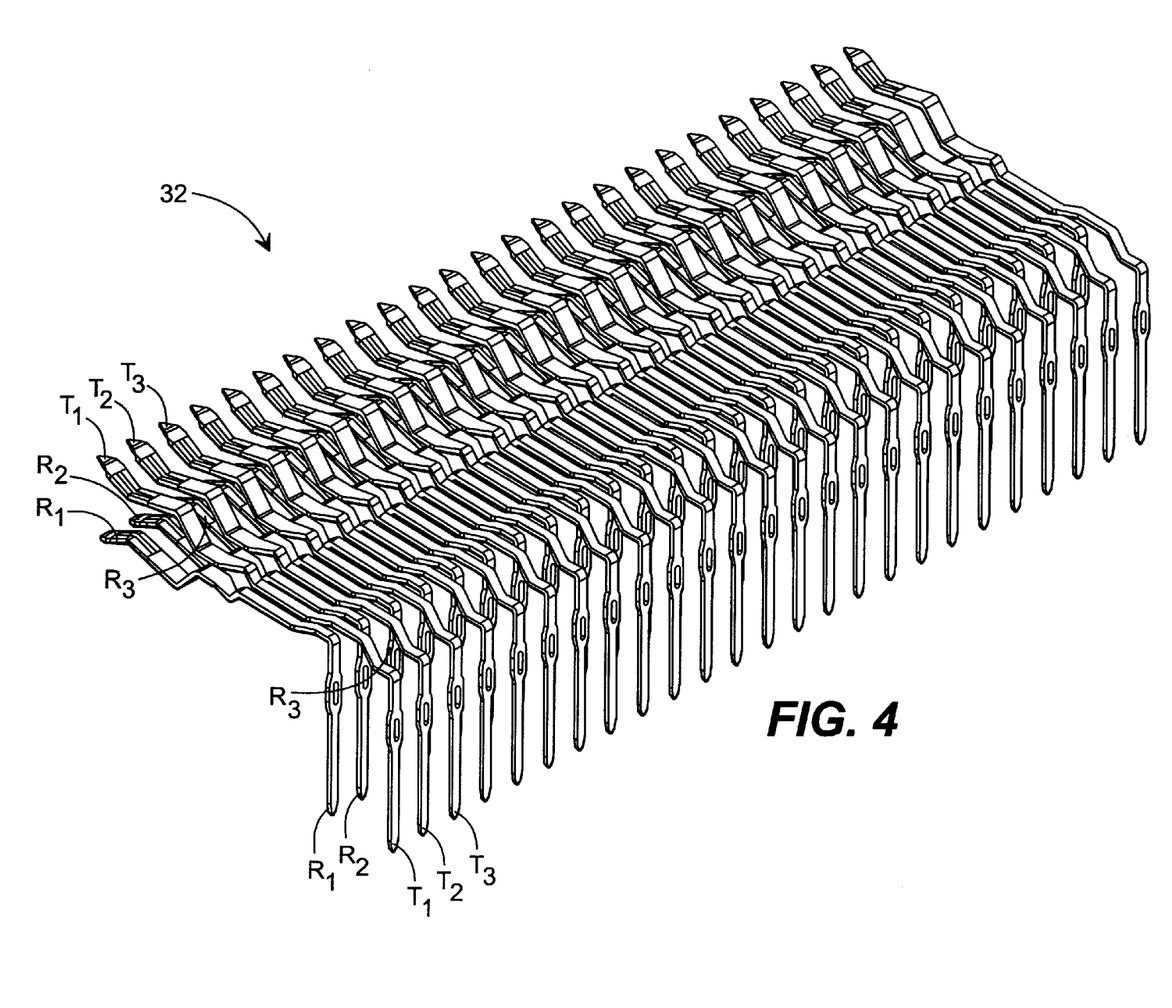
FIG. 4 is a perspective view of the configuration of the conductors of the assembly housing shown in FIG. 3.
Figure 5:
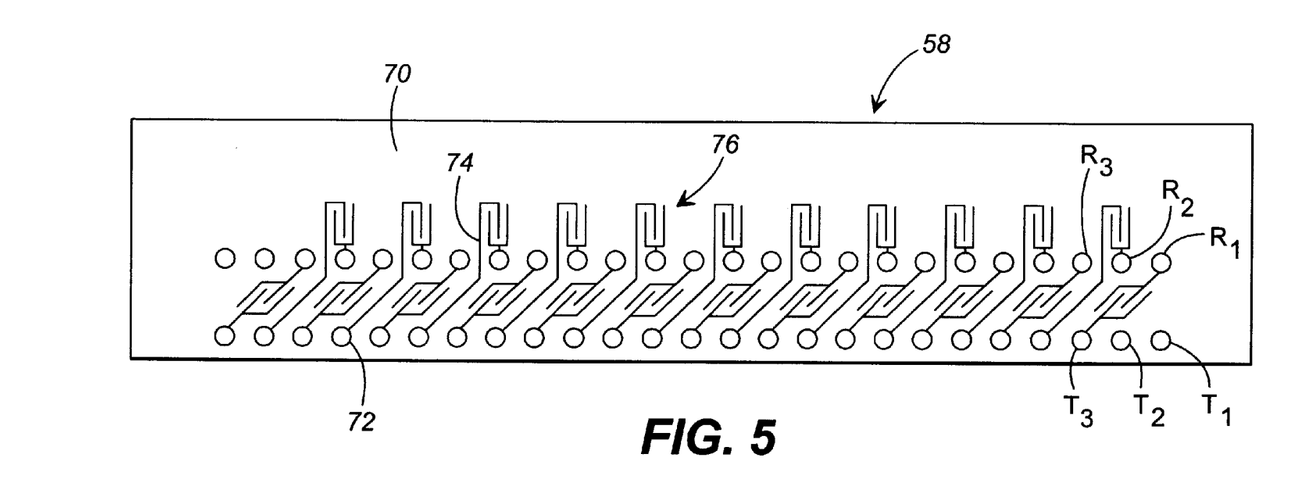
FIGS. 5–10 illustrate individual layers of an example circuit board used in the connector shown in FIGS. 1 and 2.
Figure 6:
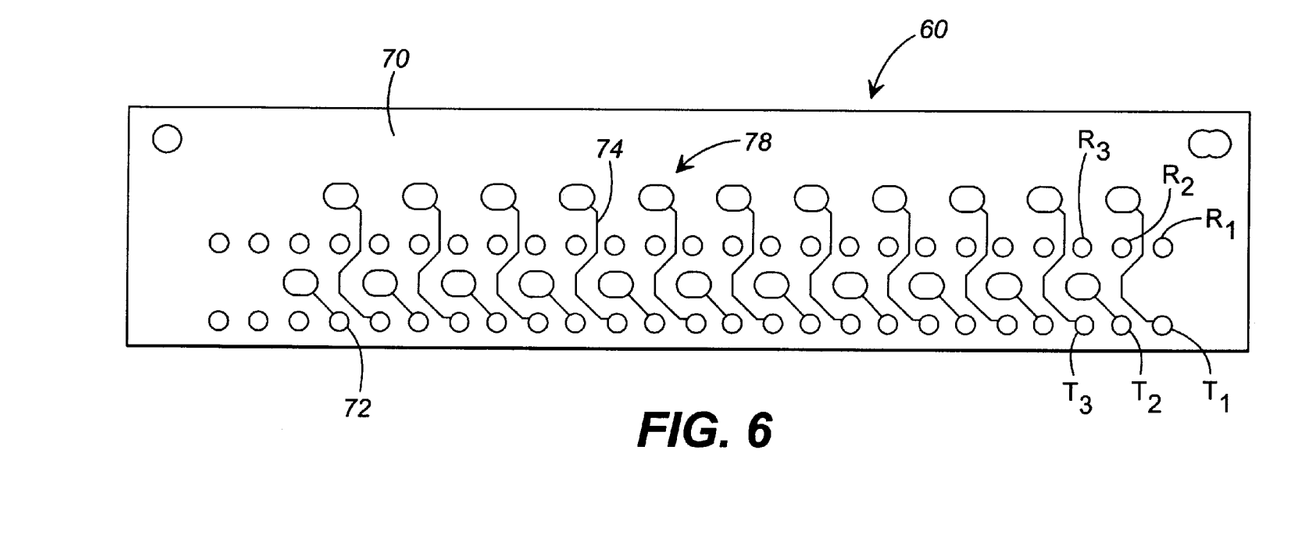
Figure 7:
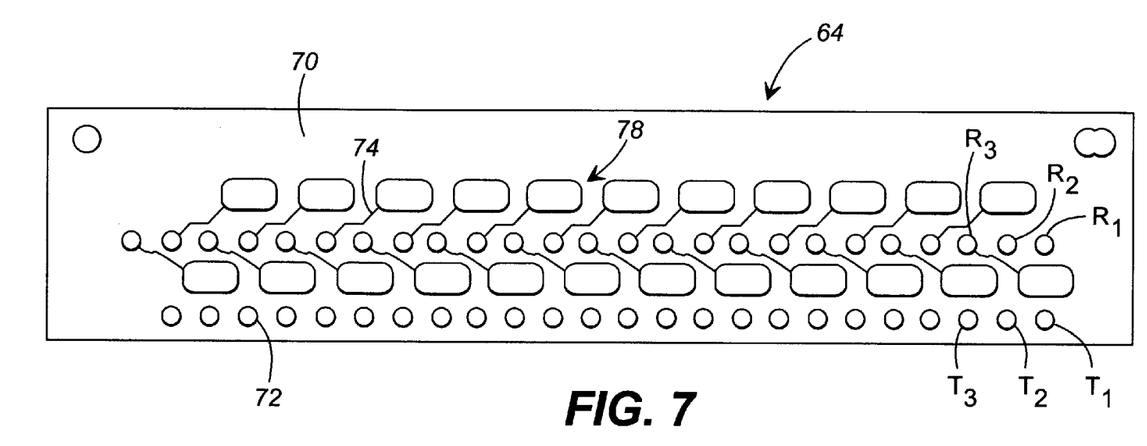
Figure 8:
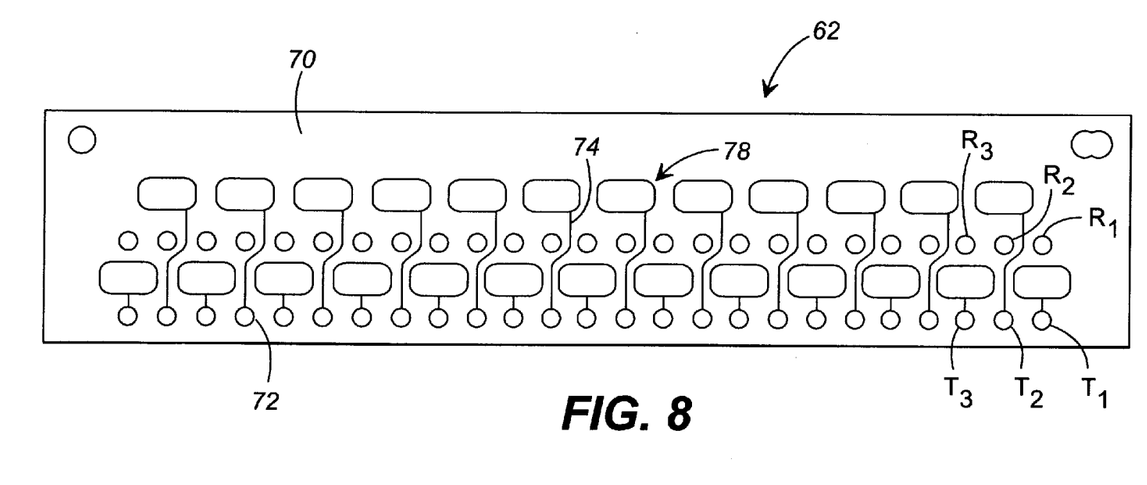
Figure 9:
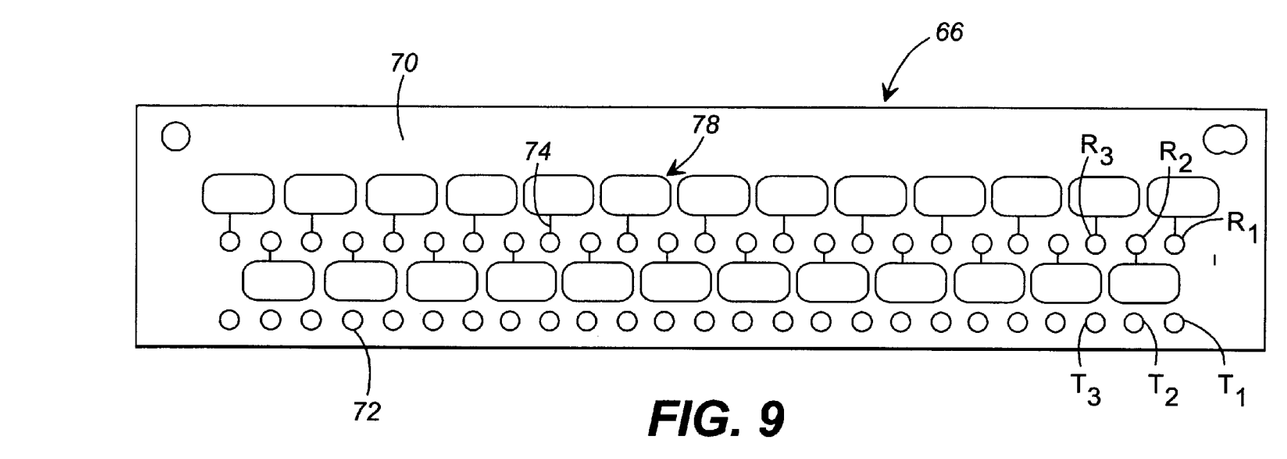
Figure 10:
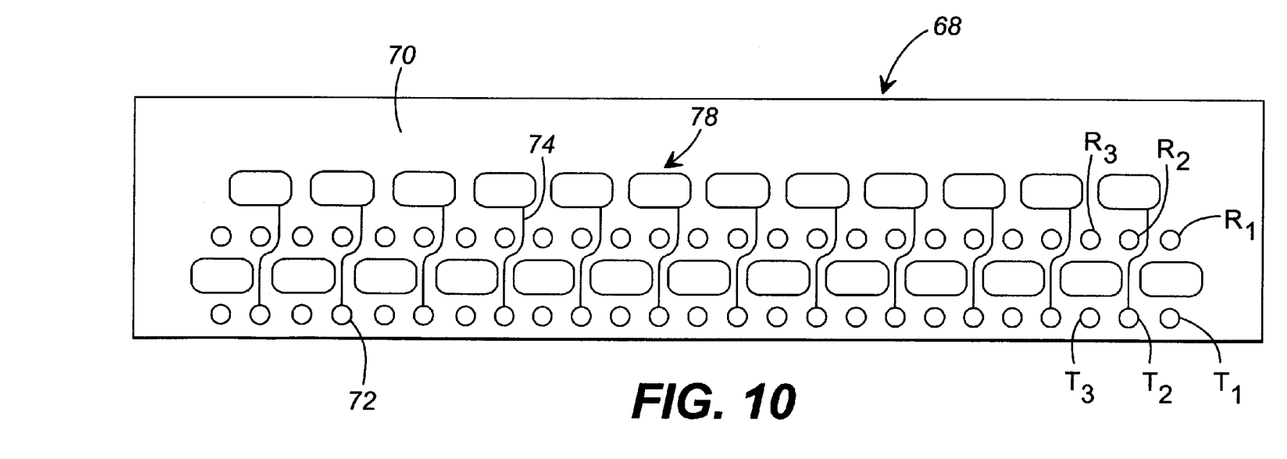

FIG. 4 illustrates an arrangement of these conductors 32 within the contact assembly housing 30, with the assembly housing removed for clarity. In this figure, the first three tip conductors are labeled $T_1$–$T_3$, while the first three ring conductors are labeled $R_1$–$R_3$. As indicated in this figure, each tip and ring pair is positioned closely adjacent to one another within the first compensation portion 52. Specifically, each tip conductor 42 is positioned closely adjacent to the ring conductor 44 of the immediately adjacent tip and ring pair with this sequence repeating continually along the length of each row. For instance, the conductor labeled $T_1$ is positioned immediately adjacent both conductors $R_1$ and $R_2$ just as the conductor labeled $T_2$ is positioned immediately adjacent both conductors $R_2$ and $R_3$. This positioning creates both inductive and conductive crosstalk that is 180° out of phase of the nearend crosstalk created by the connector 10.

Whereas the crosstalk between adjacent facing contacts, $T_1$, $T_2$, for example, results from their proximity, the positioning scheme described herein creates capacitive and inductive crosstalk from $T_1$ to $R_2$. Since $R_2$ is 180° out of phase with $T_2$, this introduction of crosstalk into the opposing face results in cancellation of overall crosstalk, and therefore compensation.

As will be appreciated by persons having ordinary skill in the art, the most desirable dimensions and spacing of the conductors 32 within the assembly housing can be determined through known techniques. For example, as an extension from the equations in Walker, *Capacitance, Inductance and Crosstalk Analysis*, (Artech House 1990) at pages 32–34, 51–53, and 101–102, the mutual capacitance unbalance, $C_{u1}$, and the mutual inductance, $L_{m1}$, between two conductor pairs, can be determined according to the following equations $$C_{uI} = \frac{\pi \epsilon_r \epsilon_0 l \ln[1 + (h/d)^2]}{\ln\left[\frac{\pi d}{a+b}\right] \ln\left[\pi \frac{\sqrt{d^2 + h^2}}{a+b}\right]} \qquad \text{Equation 1}$$

$$L_{mI} = \frac{\mu_r \mu_0}{2\pi} l \ln\left(\frac{h^2 + d^2}{d^2}\right) \qquad \text{Equation 2}$$

where l is the length of the portion of each conductor 32 in the first compensation portion 52, $\epsilon_0$ is the dielectric constant of free space, $\epsilon_r$ is the relative dielectric constant of the intervening material (the polymeric material), h is the vertical separation between conductors in a pair, d is the horizontal separation between the conductors of the pairs, a is the width of the conductors, b is the thickness of the conductors, $\mu_0$ is the permeability of free space, and $\mu_r$ is the relative permeability of the intervening material.

It is known from *Transmission Systems for Communications*, fifth edition, written by Members of Technical Staff, Bell Telephone Laboratories (Bell Telephone Laboratories, Inc. 1982) pages 127–130, that if the transmission paths are short relative to the wavelength, and assuming equal source and load impedance, the nearend crosstalk $X_1$ induced on one pair by the other pair is then given by:

$$X_1 = \frac{Z_0}{2}\left[\frac{j\omega C u_1}{4} + \frac{j\omega L_{m1}}{Z_{02}}\right] \qquad \text{Equation 3}$$

where $Z_0$ is the source or load impedance, assumed to be equal, and $\omega$ is the angular frequency of the applied signal.

The mutual capacitance unbalance, $C_{u2}$, and inductance, $L_{m2}$, between two pairs are given by:

$$C_{u2} = \epsilon_r\epsilon_0 Hl_1\left[\frac{1}{d^3} + \frac{1}{2d_2+d_3} - \frac{2}{d_2+d_3}\right] \qquad \text{Equation 4}$$

$$L_{m2} = \frac{\mu_r\mu_0 L_1}{2\pi}\ln\left[\frac{(d_2+d_3)^2+u^2}{\sqrt{[(2d_2+d_3)^2+u^2][d_3^2+u^2]}}\right] \qquad \text{Equation 5}$$

where H is the overlap height between the conductors 32 of adjacent pairs (note FIG. 4), 11 is the length of each conductor in the first compensation portion 52, $d_2$ is the spacing between the conductors of adjacent pairs, and u is horizontal offset between pairs.

The canceling near-end crosstalk, $X_2$ produced by the conductors 32 in the first compensation portion 52 is then:

$$X_2 = -\frac{Z_0}{2}\left[\frac{j\omega C u_2}{4} + \frac{j\omega L_{m2}}{Z_0^2}\right] \qquad \text{Equation 6}$$

where the minus sign indicates that this crosstalk is 180° degrees out of phase with the crosstalk produced in the contacts mating section, due to the fact that the induced crosstalk (compensation) is into the opposite phase of the offended line.

By way of example, the conductors can be arranged as specifically indicated in FIG. 4. In the embodiment shown in this figure, each the portion of each conductor 32 in the first compensation portion 52 is approximately 5.60 mm long, 0.63 mm wide, and 0.25 mm thick. As indicated in FIG. 3, the tip and ring conductors 42 and 44 preferably are contained within the same plane such that the vertical separation of the conductors is equal to zero and the overlap height is unity. In this embodiment, each conductor 32 is separated from the next by approximately 0.44 mm.

Although the first compensation portion 52 of the internal two-stage compensation system 50 provides a significant amount of capacitive and inductive crosstalk compensation, additional capacitive crosstalk compensation can be provided with a second compensation portion 54. Normally, this additional compensation is necessary because the leadframe on the other side of the compensating region will behave, albeit to a lesser extent, as another source of crosstalk similar to that of the contact region. Typically, the second compensation portion 54 comprises a multi-layered circuit board 56 that is physically attached to the contact assembly housing 30 as indicated most clearly in FIGS. 2 and 3. FIGS. 5–10 illustrate an example configuration of each of the plurality of layers that comprise the circuit board 56. In particular, each of these figures illustrates an example conductor pattern for each of the first (component side) through sixth (wiring side) of the circuit board layers 58–68. Although six layers are shown, it is to be understood that greater or fewer such layers could be used depending upon their individual configurations. As is conventional in the art, each of these layers 58–68 comprises an insulating substrate 70 including a plurality of plated through holes 72 that each is adapted to receive its own soldering pin that is compliantly interconnected thereto. In each figure, the through holes 72 adapted to receive the first three tip and ring conductors are identified by $T_1-T_3$ and $R_1-R_3$, respectively. Extending from several of these through holes 72, are conductor traces 74 that contact a capacitive device so as to electrically connect the associated solder pin with a capacitive device. The conductor traces 74 and capacitive devices together form conductor paths which can be deposited on each layer and patterned by standard techniques such as photolithography. By way of example, each trace 74 is made of copper and has a width of approximately 0.152 mm and a thickness of approximately 0.036 mm.

As depicted in FIGS. 5–10, each of the different layers 58–68 can incorporate different types of capacitance devices. For example, the first layer 58 comprises a plurality of interleaved fingers 76 which, upon receiving a transmitted electrical signal, act in the same manner as conductive parallel plates, Further by way of example, the other layers 60–68 each incorporate capacitive plates 78 of various shapes and sizes that electrically connect to a plurality of the solder pins. Arranged in this manner, the circuit board 56 reintroduces capacitive coupling to balance the residual offending signal coupling. In particular, three levels of compensation are provided: (1) compensation as to the adjacent differential pairs; (2) compensation as to the next to adjacent differential pairs; and (3) compensation as to the next to the next to adjacent differential pairs. In the embodiment depicted in FIGS. 5–10, layers 4, 5, and 6 (FIGS. 8, 9, and 10, respectively) represent compensation of the adjacent pairs. This construction produces a large amount of capacitance in a full bridge between each tip-ring/ring-tip pairing. For best null, an unequal amount of capacitance is used, as can be seen by the unequal amount of overlap of the capacitor plates 78. Layers 1, 3, and 4 (FIGS. 5, 7, and 8, respectively) provide the next to adjacent compensation and also implement a full bridge. Finally, the next to next to adjacent pair compensation is accomplished with layers 2 and 3 (FIGS. 6 and 7, respectively) with only a half bridge of capacitance. Accordingly, the second compensation portion 54 of the internal two-stage compensation system 50 serves to provide any additional compensation needed to fine tune the connector 10 to ensure category 5E performance.

While preferred embodiments of the invention have been disclosed in detail in the foregoing description and drawings, it will be understood by those skilled in the art that variations and modifications thereof can be made without departing from the spirit and scope of the invention as set forth in the following claims.

What is claimed is:

1. An electrical connector, comprising:

an insulating housing;

a plurality of conductors mounted within said insulating housing in at least two rows of aligned pairs, a first end portion of each conductor being adapted to electrically connect with contacts of another connector and a second end portion of each conductor being adapted to electrically connect with an electrical device;

a first compensation section located within said insulating housing, said conductors being arranged within said first compensation section in an orientation to provide a first crosstalk compensation; and a second compensation section located within said connector and in electrical contact with at least two of said conductors that provides a second crosstalk compensation.

2. The connector of claim 1, wherein said conductors are arranged within said first compensation section so as to be positioned substantially in side-by-side alignment within a plane.

3. The connector of claim 2, wherein the length of said conductors within said first compensation section is approximately 5.60 mm.

4. The connector of claim 2, wherein the width, thickness, and separation distance between said conductors within said first compensation section are approximately 0.63 mm, 0.25 mm, and 0.44 mm, respectively.

5. The connector of claim 1, wherein said second compensation section comprises a multi-layered circuit board.

6. The connector of claim 5, wherein each layer of said circuit board comprises a plurality of capacitive devices.

7. The connector of claim 6, wherein said capacitive devices include interleaved fingers and capacitor plates.

8. The connector of claim 1, wherein the electrical device is a printed circuit board and said connector is a 25 pair Category 5 power sum circuit board mount jack.

9. An electrical connector, comprising:

an insulating housing comprising an inner assembly housing;

a plurality of conductors mounted within said insulating housing in at least two rows of aligned pairs, a first end portion of each conductor being adapted to electrically connect with contacts of another connector and a second end portion of each conductor being adapted to electrically connect with a printed circuit board;

a first compensation section located within said assembly housing of said insulating housing, said conductors being arranged within said first compensation section such that a medial portion of each conductor is in a substantially side-by-side alignment within a single plane to provide a first crosstalk compensation; and a second compensation section connected to said assembly housing in close proximity to said first compensation section within said connector that provides a second crosstalk compensation, said second compensation section including a multi-layered circuit board.

10. The connector of claim 9, wherein each layer of said circuit board comprises a plurality of capacitive devices.

11. The connector of claim 9, wherein said connector is a 25 pair Category 5 power sum circuit board mount jack.

* * * * *